United States Patent
Song et al.

(10) Patent No.: US 6,809,546 B2
(45) Date of Patent: Oct. 26, 2004

(54) ON-CHIP TERMINATION APPARATUS IN SEMICONDUCTOR INTEGRATED CIRCUIT, AND METHOD FOR CONTROLLING THE SAME

(75) Inventors: Ho-Young Song, Yongin (KR); Seong-jin Jang, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/287,136

(22) Filed: Nov. 4, 2002

(65) Prior Publication Data

US 2003/0197525 A1 Oct. 23, 2003

(30) Foreign Application Priority Data

Apr. 19, 2002 (KR) ......................................... 2002-21684

(51) Int. Cl.[7] .............................................. H03K 17/16
(52) U.S. Cl. .............................. 326/30; 326/34; 326/87
(58) Field of Search ............................... 326/30–34, 87

(56) References Cited

U.S. PATENT DOCUMENTS 5,467,455 A * 11/1995 Gay et al. ................... 710/100
5,831,467 A   11/1998 Leung et al. ................ 327/319
6,026,456 A * 2/2000 Ilkbahar ...................... 710/100

FOREIGN PATENT DOCUMENTS

KR          00-021260         4/2000

* cited by examiner

*Primary Examiner*—Anh Q. Tran
(74) *Attorney, Agent, or Firm*—F.Chau & Associates, LLC

(57) ABSTRACT

Provided are an on-chip termination apparatus in a semiconductor integrated circuit, and a method for controlling the same. The on-chip termination apparatus is installed in a semiconductor integrated circuit that has an output driver for outputting data to the outside via a pad and a data input circuit for receiving data from the outside via the pad. The on-chip termination apparatus includes an on-chip terminator including at least one terminal resistor electrically connected to the pad; and a terminator control circuit for turning on or off the on-chip terminator in response to an output enable signal that enables or disables the data output circuit, wherein the terminator control circuit turns off the on-chip terminator in the event that the data output circuit is enabled. Therefore, the on-chip termination apparatus is controlled by an output enable signal, thereby reducing timing loss, thus enabling a system to operate at high speed.

18 Claims, 4 Drawing Sheets

ON-CHIP TERMINATION APPARATUS IN SEMICONDUCTOR INTEGRATED CIRCUIT, AND METHOD FOR CONTROLLING THE SAME

PRIORITY

This application claims priority to an application entitled "ON-CHIP TERMINATION APPARATUS IN SEMICONDUCTOR INTEGRATED CIRCUIT, AND METHOD FOR CONTROLLING THE SAME" filed in the Korean Industrial Property Office on Apr. 19, 2002 and assigned Serial No. 2002-21684, the contents of which are hereby incorporated by reference.

BACKGROUND OF THE INVENTION

1. Field of the Invention

The present invention relates to semiconductor integrated circuits, and more particularly, to an on-chip terminator that terminates a transmission line in a semiconductor integrated circuit, and a circuit and method for controlling the on-chip terminator.

2. Description of the Related Art

In general, when a data signal is communicated at high speed between circuit devices, reflection of the data signal occurs if the devices are not impedance matched. Thus, an information signal exchange system requires a terminal resistor that terminates a bus for impedance matching. The terminal resistor suppresses the reflection of a received signal to raise the integrity of the signal transferred.

The terminal resistor may be located on the inside or outside of a semiconductor-integrated chip (hereinafter referred to as, "semiconductor chip"). The terminal resistor in a semiconductor chip is usually called an on-chip terminator, on-die terminator or active terminator.

To be effectively used in a semiconductor chip, the on-chip terminator needs to be appropriately controlled according to an operation mode of the semiconductor chip, taken in consideration of power consumption and signal integrity. In other words, the on-chip terminator should be controlled differently depending on whether the operation mode is an input mode, an output mode, or a power down mode.

However, in the prior art, there is no particular apparatus, such as a circuit, for controlling an on-chip terminator included in a semiconductor chip, and thus, the on-chip terminator is controlled only in response to a control signal input from the outside of the semiconductor chip. In the prior art, since there is no apparatus for controlling an on-chip terminator, the terminal resistor is always connected between an input/output node and terminal voltage VTERM and/or ground. Thus, a current path is formed between the terminal voltage VTERM and ground, causing unnecessary power consumption. Also, in this case, the level of an output signal is lower than normal. Thus, there is a need to appropriately turn on or off the on-chip terminator.

FIG. 1 is a circuit diagram of a semiconductor chip including an on-chip terminator 110. The on-chip terminator 110 is controlled by a terminator driving signal TE input from the outside of the semiconductor chip.

The on-chip terminator 110 includes first and second terminal resistors R1 and R2, and first and second switches S11 and S12. When the first switch S11 is turned on, the first terminal resistor R1 is connected to the terminal voltage VTERM, and when the second switch S12 is turned on, the second terminal resistor R2 is connected to the grounding voltage. Here, the first and second switches S11 and S12 are turned on or off in response to the output terminator driving signal TE.

As shown in FIG. 1, since the on-chip terminator 110 is controlled in response to the terminator driving signal TE input from the outside of the semiconductor chip, control of the on-chip terminator 110 at a desired instant of time is not usually achieved. For instance, when data is transmitted from a first semiconductor chip to a second semiconductor chip, the first semiconductor chip sends the terminator-driving signal TE to the second semiconductor chip so as to operate an on-chip terminator in the second data chip. Next, after a predetermined time interval, the first semiconductor chip sends the data to the second semiconductor chip. Thereafter, the first semiconductor chip inactivates the terminator-driving signal TE in a predetermined time after the completion of transmission of the data.

Therefore, if the on-chip terminator 110 is controlled asynchronously with a signal input from the outside of the semiconductor chip, the time margin is required to start and complete transmission of data. In this regard, an on-chip terminator is not available in a semiconductor chip that operates at high speed. Also, a semiconductor chip having an on-chip terminator requires complicated circuitry so as to control the on-chip terminator by receiving an external signal and converting the signal into an internal signal.

For these reasons, a semiconductor chip having an on-chip terminator additionally requires a control circuit that turns on/off the on-chip terminator at a desired instant of time, using an external signal and/or an internal signal generated by the semiconductor chip, thereby reducing power consumption and enabling high-speed transmission of data. Hereinafter, a combination of such a control circuit and an on-chip terminator is called an "on-chip termination apparatus".

SUMMARY OF THE INVENTION

An embodiment of the present invention provides an on-chip termination apparatus and method that controls an on-chip terminator at a desired instant of time using a signal generated by a semiconductor chip, thereby increasing the efficiency of transmission of data and reducing time loss.

There is also provided a semiconductor integrated circuit including an output buffer for generating an output driver driving signal in response to output data and a predetermined output enable signal; an output driver for transmitting the output data to outside of the semiconductor integrated circuit in response to the output driver driving signal; an on-chip terminator having at least one terminal resistor; and a terminator control circuit for turning on or off the on-chip terminator in response to the output enable signal.

Preferably, the terminator control circuit turns off the on-chip terminator in response to an activation of the output enable signal, and turns on the on-chip terminator in response to an inactivation of the output enable signal.

Preferably, the terminator control circuit comprises a replica of the output buffer, which has the same delay time as the output buffer.

According to another embodiment of the invention, there is provided an on-chip termination apparatus installed in a semiconductor integrated circuit that has a data output circuit for outputting data to the outside of the semiconductor integrated circuit via a pad and a data input circuit for receiving data from the outside via the pad, the on-chip termination apparatus including an on-chip terminator including at least one terminal resistor that is electrically connected to the pad; and a terminator control circuit for turning on or off the on-chip terminator in response to an output enable signal that enables or disables the data output circuit.

Preferably, the terminator control circuit turns off the on-chip terminator in response to an activation of the output enable signal, and turns on the on-chip terminator in response to an inactivation of the output enable signal.

According to still another embodiment of the invention, there is provided a method for controlling an on-chip terminator in a semiconductor integrated circuit including the on-chip terminator that has at least one bi-directional data input/output unit, an output driver for transmitting output data to the outside of the semiconductor integrated circuit, and at least one terminal resistor. The method includes generating an output enable signal for enabling/disabling the output driver; and turning on or off the on-chip terminator in response to the output enable signal, wherein the on-chip terminator is turned off in response to an activation of the output enable signal and the on-chip terminator is turned on in response to an inactivation of the output enable signal.

BRIEF DESCRIPTION OF THE DRAWINGS

The present invention will become more apparent by describing in detail-preferred embodiments thereof with reference to the attached drawings in which.

DETAILED DESCRIPTION OF PREFERRED EMBODIMENTS

For a better understanding of the present invention, before describing preferred embodiments of the invention with reference to the accompanying drawings, a concept of the present invention will be briefly described.

Several semiconductor chips are set to output or receive data via the same pin, that is, the same pin is shared by a plurality of semiconductor chips for input/output of data. Such a pin is called a bi-directional input/output pin. A semiconductor chip, which includes at least one bi-directional input/output pin (or a bi-directional input/output unit), requires an output enable signal OE for turning on an output driver only during output of data. In the present invention, an on-chip terminator is set to be turned on/off in response to the output enable signal OE used in a semiconductor chip having at least one bi-directional input/output unit.

Figure 1:
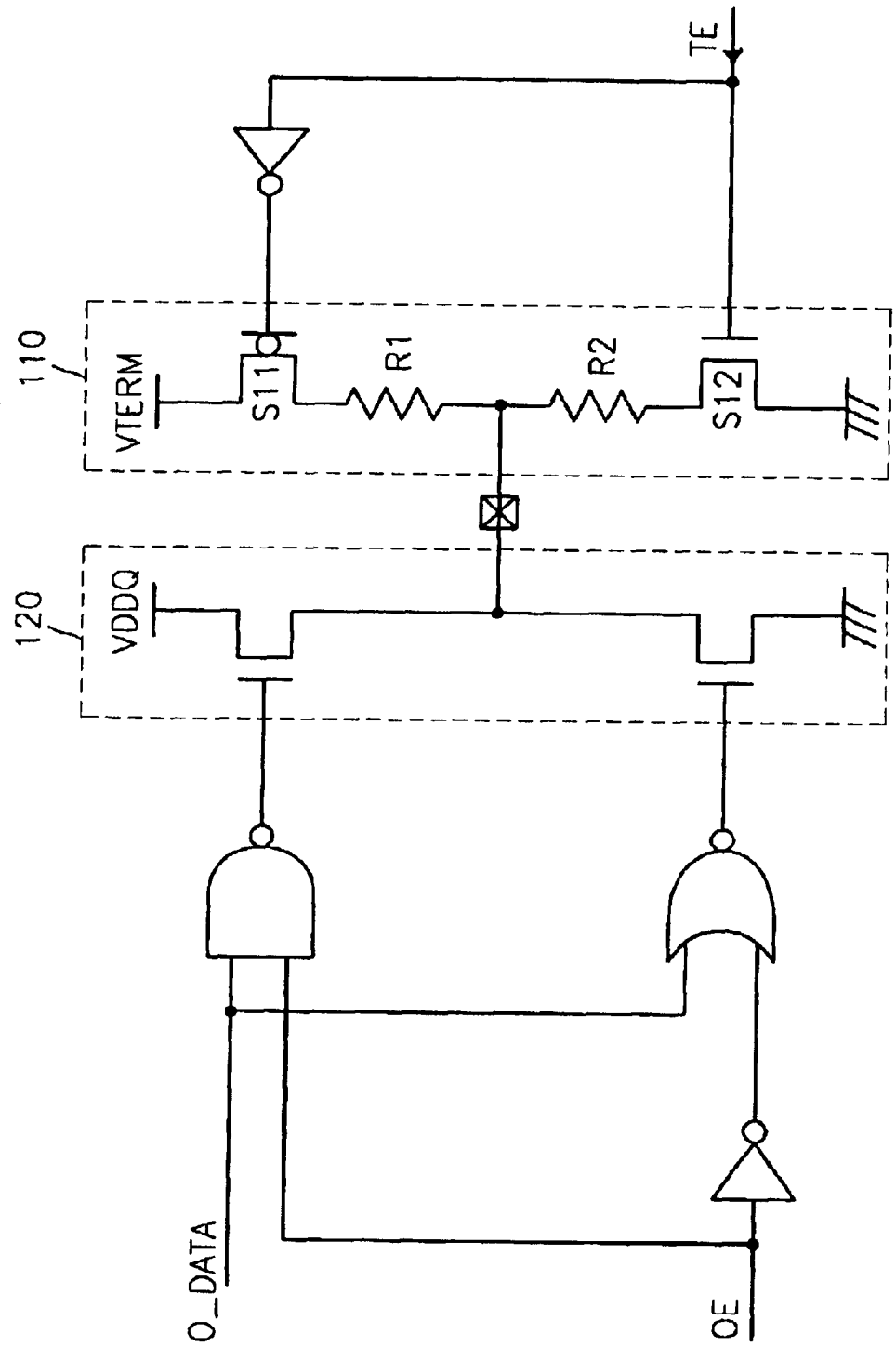
FIG. 1 is a circuit diagram of a semiconductor chip having a conventional on-chip terminator.
Figure 2:
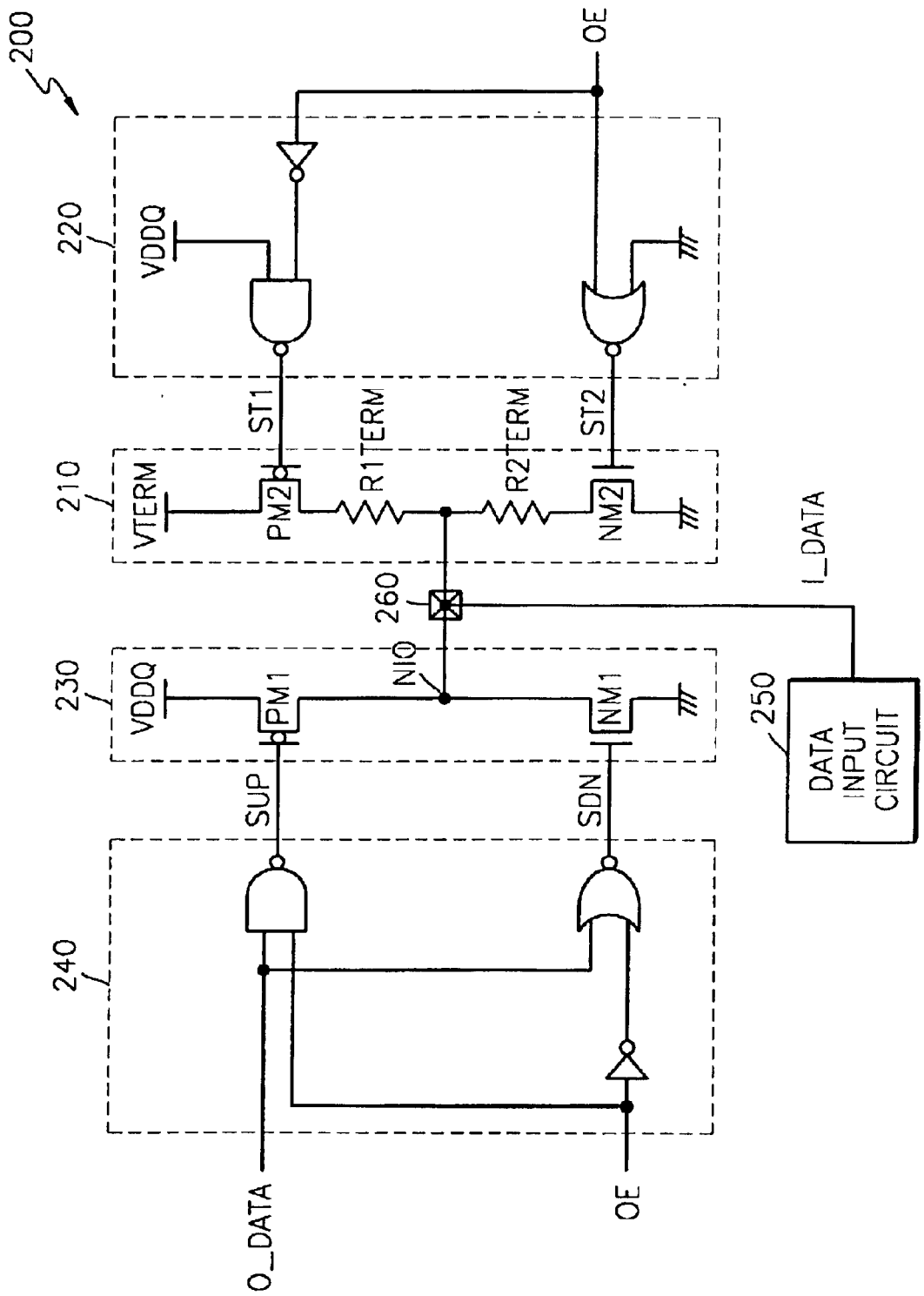
FIG. 2 is a circuit diagram of a semiconductor chip having an on-chip termination apparatus according to a first embodiment of the present invention.

FIG. 2 is a circuit diagram of a semiconductor chip 200 having an on-chip termination apparatus according to a first embodiment of the present invention. Referring to FIG. 2, the semiconductor chip 200 includes an on-chip terminator 210, a terminator control circuit 220, data output circuits 230 and 240, and a data input circuit 250.

The data output circuits 230 and 240 include an output buffer 240 and an output driver 230. The data output circuits 230 and 240 outputs output data O_DATA to the outside of the semiconductor chip 200 via a data pin (not shown) connected to a pad 260.

The data input circuit 250 receives data I_DATA output from the outside via the data pin and the pad 260, and processes the data I_DATA. In general, the data output circuits 230 and 240 and the data input circuit 250 together make a data input/output circuit, which is installed for every data pin.

The data input/output circuit, which inputs and outputs data via the same pin, is called a bi-directional input/output circuit or a bi-directional buffer. In the case of the bi-directional input/output circuit, an output enable signal OE is used to turn on the output driver 230 only during output of data.

The on-chip terminator 210 includes first and second terminal resistors R1TERM and R2TERM, and first and second switches PM2 and NM2. The first and second terminal resistors R1TERM and R2TERM are electrically connected to the pad 260. The first switch PM2 is placed between terminal voltage VTERM and the first terminal resistor R1TERM, and controls a connection between the first terminal resistor R1TERM and the terminal voltage VTERM. The second switch NM2 is installed between the second terminal resistor R2TERM and grounding voltage, and controls a connection between the second terminal resistor R2TERM and the grounding voltage.

The first and second terminal resistors R1TERM and R2TERM are connected to the terminal voltage VTERM and the grounding voltage, respectively. The first and second terminal resistors R1TERM and R2TERM function as terminal resistors.

The first switch PM2 is turned on in response to a first termination control signal ST1, and the first terminal resistor R1TERM is connected to the terminal voltage VTERM when the first switch is on. The second switch NM2 is turned on in response to a second termination control signal ST2, and the second terminal resistor R2TERM is connected to the grounding voltage when the second switch NM2 is on.

In this embodiment, the first switch PM2 is a PMOS transistor that is gated in response to the first termination control signal ST1, and the second switch NM2 is an NMOS transistor that is gated in response to the second termination control signal ST2.

The first and second termination control signals ST1 and ST2 are output from the terminator control circuit 220. The terminator control circuit 220 receives the output enable signal OE and generates the first and second termination control signals ST1 and ST2.

More specifically, when the output enable signal OE is activated to a predetermined first level (hereinafter referred to as, "high level"), the terminator control circuit 220 generates the first termination control signal ST1 having a high level and the second termination control signal ST2 having a predetermined second level (hereinafter referred to as, "low level"). As a result, both the first and second switches PM2 and NM2 are turned off, and the first and second terminal resistors R1TERM and R2TERM are separated from the terminal voltage VTERM and the grounding voltage, respectively. Therefore, the first and second terminal resistors R1TERM and R2TERM do not function as terminal resistors. Here, the fact that the first and second terminal resistors R1TERM and R2TERM are separated from the terminal voltage VTERM and the grounding voltage, respectively, means that the on-chip terminator 210 is turned off.

On the other hand, when the output enable signal OE is inactivated to a low level, the terminator control circuit 220 generates the first termination control signal ST1 having a low level and the second termination control signal ST2 having a high level. As a result, both the first and second switches PM2 and NM2 are turned on, and thus, the first and second terminal resistors R1TERM and R2TERM are connected to the terminal voltage VTERM and the grounding voltage, respectively. Therefore, the first and second terminal resistors R1TERM and R2TERM function as terminal resistors. Here, the fact that the first and second terminal resistors R1TERM and R2TERM are connected to the terminal voltage VTERM and the grounding voltage, respectively, means that the on-chip terminator 210 is turned on.

While the output enable signal OE is activated, the output driver 230 is enabled and outputs the output data O_DATA to the outside. The output enable signal OE is activated to a high level in an output mode of the semiconductor chip 200 when the output data O_DATA is transmitted to the outside of the semiconductor chip 200. In contrast, while the output enable signal OE is inactivated, the output driver 230 is disabled, and thus, the semiconductor chip 200 can receive data from the outside.

Therefore, the terminator control circuit 220 turns off the on-chip terminator 210 during the output mode of the semiconductor chip 200, i.e., when the output driver 230 is enabled, and turns on the on-chip terminator 210 during a non-output mode of the semiconductor chip 200, i.e., when the output driver 230 is disabled.

Hereinafter, exemplary structures of the output driver 230 and the output buffer 240, which constitute data output circuits 230 and 240, are described in detail.

First, the output driver 230 drives an input/output node NIO to a predetermined voltage level to transmit data from the semiconductor chip 200 to the outside of the semiconductor chip 200. The output driver 230 shown in FIG. 2 is a push-pull driver including a pull-up transistor PM1 and a pull-down transistor NM1. The pull-up transistor PM1 is on in response to a pull-up driving signal SUP, and drives the input/output node NIO to a power voltage VDDQ level. The pull-down transistor NM1 is on in response to a pull-down driving signal SDN, and drives the input/output node NIO to a grounding voltage level. Here, the pull-up driving signal SUP and the pull-down driving signal SDN may be output driver-driving signals.

The pull-up driving signal SUP and the pull-down driving signal SDN are determined by the output data O_DATA and the output enable signal OE. The output buffer 240 receives the output data O_DATA and the output enable signal OE and outputs the pull-up driving signal SUP and the pull-down driving signal SDN.

While the output enable signal OE is activated to a high level, the pull-down driving signal SDN and the pull-up driving signal SUP reach an inversion level of the output data O_DATA. That is, when the output data O_DATA is at a high level, the pull-down driving signal SDN and the pull-up driving signal SUP reach a low level, whereas when the output data O_DATA is at a low level, the pull-down driving signal SDN and the pull-up driving signal SUP reach a high level.

When the level of the output data O_DATA is low, the pull-down transistor NM1 is turned on and the pull-up transistor PM1 is turned off, which drives the input/output node NIO to a grounding voltage level. When the level of the output data O_DATA is high, the pull-up transistor PM1 is turned on and the pull-down transistor NM1 is turned off, which drives the input/output node NIO to a power voltage VDDQ level.

Meanwhile, if the output enable signal OE is inactivated to a low level, the pull-down driving signal SDN reaches a low level and the pull-up driving signal SUP reaches a high level irrespective of the output data O_DATA. As a result, both the pull-down transistor NM1 and the pull-up transistor PM1 are turned off, and the output driver 230 is disabled.

Preferably, the terminator control circuit 220 is a replica of the output buffer 240 such that it has substantially the same delay time as the output buffer 240. In other words, more preferably, the time spent by the output buffer 240 to turn on/off the output driver 230 in response to the output enable signal OE is substantially the same as the time spent by the terminator control circuit 220 to turn on/off the on-chip terminator 210 in response to the output enable signal OE. By the fact that the terminator control circuit 220 and the output buffer 240 have substantially the same delay time, it is understood that the delay time they have falls within a predetermined error range.

In conclusion, the on-chip terminator 210 is turned off when the output enable signal OE is activated, thereby preventing a reduction in the level of an output signal. Further, in an on-chip termination apparatus according to the present invention, power consumption is less than in an on-chip terminator that is set to be turned on all the time.

The output enable signal OE is generated to be aligned with respect to an outer clock, using a delay-locked loop or a phase-locked loop. Using this characteristic of the output enable signal OE, it is possible to control the operations of the on-chip terminator 210. That is, the on-chip terminator 210 is turned on or off in synchronization with the output enable signal OE, thereby reducing timing loss. Therefore, an on-chip termination apparatus according to the present invention enables a system having the semiconductor chip 200 to operate at high speed.

Figure 3:
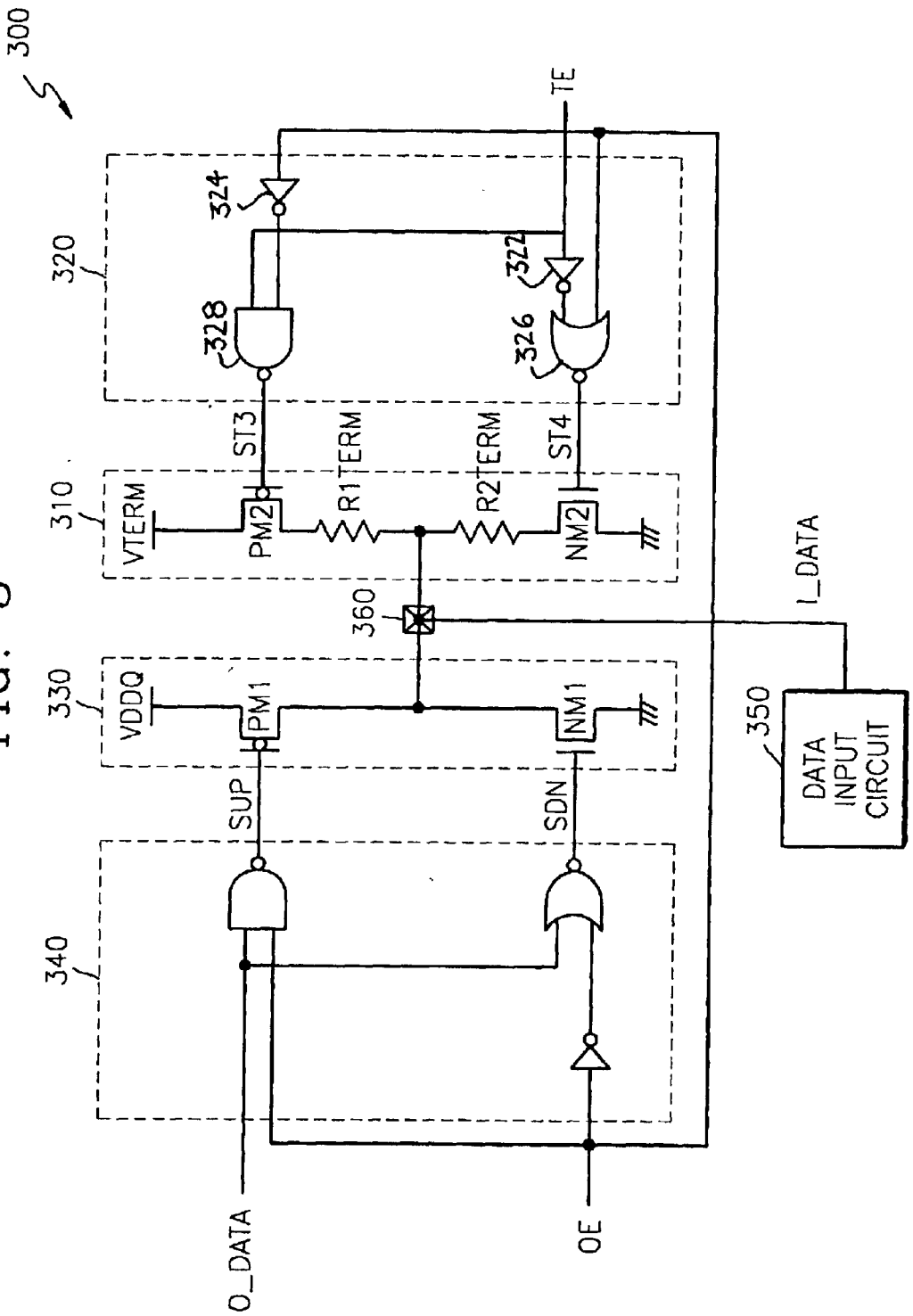
FIG. 3 is a circuit diagram of a semiconductor chip having an on-chip termination apparatus according to a second embodiment of the present invention.

FIG. 3 is a circuit diagram of a semiconductor chip 300 having an on-chip termination apparatus according to a second embodiment of the present invention. Referring to FIG. 3, the semiconductor chip 300 includes an on-chip terminator 310, a terminator control circuit 320, data output circuits 330 and 340, and a data input circuit 350.

The data output circuits 330 and 340 include an output buffer 340 and an output driver 330. In this embodiment, the data output circuits 330 and 340 and the data input circuit 350 have the same structure and functions as the data output circuits 230 and 240 and the data input circuit 250 shown in FIG. 2, and thus, their structure and functions will be omitted. The on-chip terminator 310 has the same structure and functions as the on-chip terminator 210 of FIG. 2, and a description thereof will be also omitted.

The terminator control circuit 320 generates first and second termination control signals ST3 and ST4, using a predetermined terminator driving signal TE together with an output enable signal OE. In other words, the terminator control circuit 320 combines the output enable signal OE with the terminator-driving signal TE to form the first and second termination control signals ST3 and ST4. Here, the terminator-driving signal TE may be a signal input from the outside of the semiconductor chip 300(an external signal), an internal signal, or a combination of the external signal and the internal signal.

The terminator control circuit 320 generates the first termination control signal ST3 having a high level and the second termination control signal ST4 having a low level irrespective of the terminator driving signal TE when the output enable signal OE is activated to a high level. As a result, both first and second switches PM2 and NM2 are turned off, and the first and second terminal resistors R1TERM and R2TERM are separated from termination voltage VTERM and grounding voltage, respectively. Accordingly, the on-chip terminator 310 is turned off.

Meanwhile, when the output enable signal OE is inactivated to a low level, the terminator control circuit 320 generates the first termination control signal ST3 and the second termination control signal ST4 in response to the terminator driving signal TE. In this case, the level of the first termination control signal ST3 depends on the level of the terminator driving signal TE. That is, when both the level of the output enable signal OE and the level of the terminator driving signal TE are low, the first termination control signal ST3 reaches a high level and the second termination control signal ST4 reaches a low level, thereby turning off the on-chip terminator 310. On the other hand, when the output enable signal OE reaches a low level and the terminator driving signal TE reaches a high level, the first termination control signal ST3 reaches a low level and the second termination control signal ST4 reaches a high level, thereby turning on the on-chip terminator 310.

In this embodiment, the terminator control circuit 320 is realized with a first and second inverter 322 and 324, a NOR gate 326 and a NAND gate 328. Preferably, the terminator control circuit 320 is a replica of the output buffer 340 such that it has substantially the same delay time as the output buffer 340. That is, preferably, the time spent by the output buffer 340 to turn on/off the output driver 330 in response to the output enable signal OE, is substantially the same as the time spent by the terminator control circuit 320 to turn on/off the on-chip terminator 310 in response to the output enable signal OE.

The on-chip terminator 310 of FIG. 3 is set to be turned on only when the terminator driving signal TE is activated. Therefore, power consumption in the on-chip terminator 310 is less than in the on-chip terminator 210 of FIG. 2 according to the first embodiment of the present invention.

As can be seen from FIG. 3, the terminator control circuit 320 according to the present invention can use another signal together with the output enable signal OE in controlling the on-chip terminator 310. For instance, in the event that an internal signal indicating power-down mode of the semiconductor chip 300 is used in controlling the on-chip terminator 310, it is possible to minimize power consumption in the on-chip terminator 310.

Figure 4:
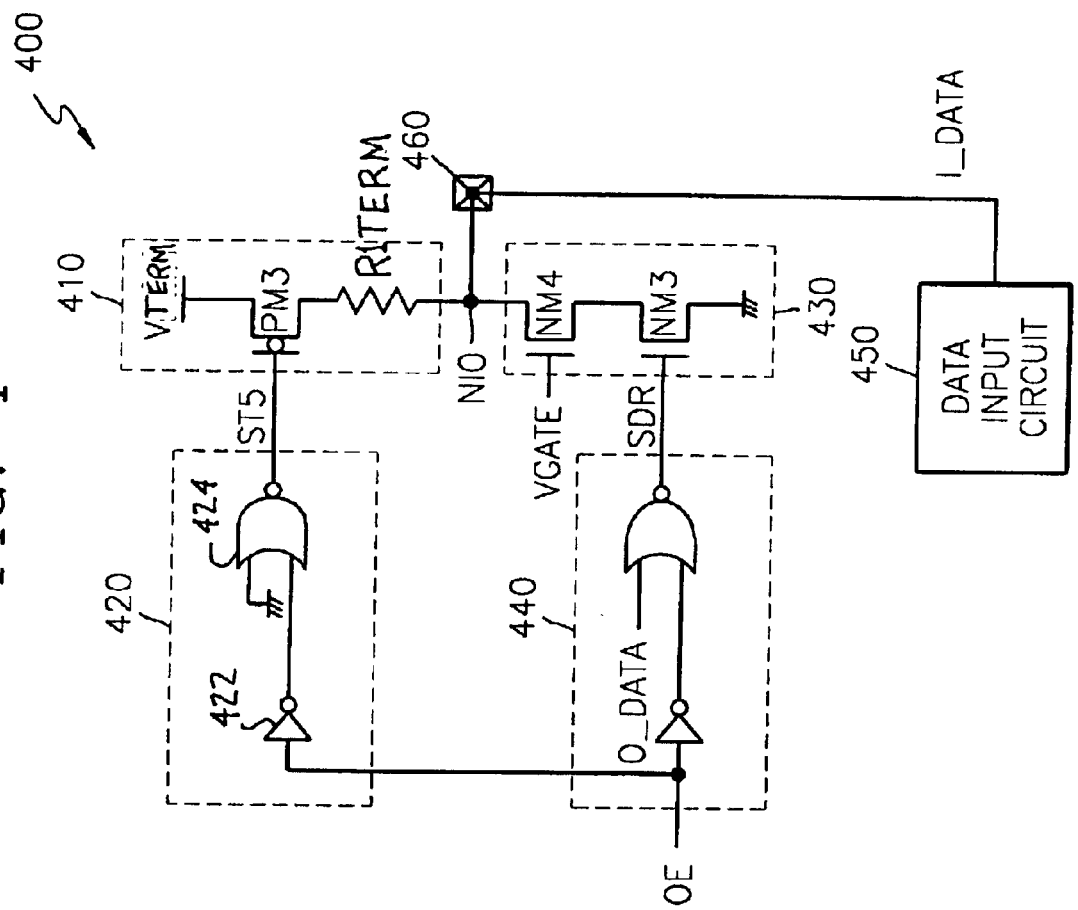
FIG. 4 is a circuit diagram of a semiconductor chip having an on-chip termination apparatus according to a third embodiment of the present invention.

FIG. 4 is a circuit diagram of a semiconductor chip 400 having an on-chip termination apparatus according to a third embodiment of the present invention. Referring to FIG. 4, the semiconductor chip 400 includes an on-chip terminator 410, a terminator control circuit 420, data output circuits 430 and 440, and a data input circuit 450.

The structure and functions of the data input circuit 450 are the same as those of the data input circuit 250 of FIG. 2, and a description thereof will be omitted here.

The output driver 430 of FIG. 4 is an open drain driver that includes first and second driving transistors NM4 and NM3.

The first and second driving transistors NM4 and NM3 are NMOS transistors, and are connected in series between an input/output node NIO and grounding voltage. Gate voltage VGATE is applied to a gate of the first driving transistor NM4, and an output driver driving signal SDR is input to a gate of the second driving transistor NM3. The positions of the first and second driving transistors NM4 and NM3 may be switched from each other. Here, the level of the gate voltage VGATE falls within a predetermined range when the first driving transistor NM4 is turned on.

The second driving transistor NM3 is turned on/off in response to the output driver driving signal SDR. When the second driving transistor NM3 is on, the input/output node NIO is driven to a grounding voltage level, and when the second driving transistor NM3 is off, the input/output node NIO is open.

The output buffer 440 receives an output data O_DATA and an output enable signal OE and outputs the output driver driving signal SDR.

During the activation of the output enable signal OE, the output driver driving signal SDR reaches an inversion level of the output data O_DATA. That is, when the output data O_DATA is at a high level, the output driver driving signal SDR reaches a low level, and when the output data O_DATA is at a low level, the output driver driving signal SDR reaches a high level.

Thus, when the level of the output data O_DATA is low, the second driving transistor NM3 is turned on and the input/output node NIO is driven to the grounding voltage level. When the level of the output data O_DATA is high, the output driver driving signal SDR is turned off, and the input/output node NIO is open.

The on-chip terminator 410 includes terminal resistor R1TERM and a switch PM3. The terminal resistor R1TERM is electrically connected to a pad (not shown). The switch PM3 is installed between the terminal voltage VTERM and the terminal resistor R1TERM, and controls a connection between the terminal resistor R1TERM and the terminal voltage VTERM.

The switch PM3 is turned on in response to a termination control signal ST5, and the first terminal resistor R1TERM is connected to the terminal voltage VTERM when the switch PM3 is on. Here, the switch PM3 is a PMOS transistor.

The termination control signal ST5 is generated by the terminator control circuit 420. The terminator control circuit 420 receives the output enable signal OE and generates the termination control signal ST5.

The terminator control circuit 420 generates the termination control signal ST5 of a high level when the output enable signal OE is activated to a high level. As a result, the switch PM3 is off, the terminal resistor R1TERM is separated from the terminal voltage VTERM, and the on-chip terminator 410 is off.

On the other hand, the terminator control circuit 420 generates the termination control signal ST5 when the output enable signal OE is inactivated to a low level. As a result, the switch PM3 is on, the terminal resistor R1TERM is connected to the terminal voltage VTERM, and the on-chip terminator 410 is on.

In this embodiment, the terminator control circuit 420 is realized with an inverter 422 and an NOR gate 424. Preferably, the terminator control circuit 420 is a replica of the output buffer 440 such that it has substantially the same delay time as the output buffer 440. In other words, the time spent by the output buffer 440 to turn on/off the output driver 430 in response to the output enable signal OE is substantially the same as the time spent by the terminator control circuit 420 to turn on/off the on-chip terminator 410 in response to the output enable signal OE.

While this invention has been particularly shown and described with reference to preferred embodiments thereof, it will be understood by those skilled in the art that various changes in form and details may be made therein without departing from the spirit and scope of the invention as defined by the appended claims and equivalents thereof. For instance, according to an embodiment of the present invention, an on-chip terminator can be controlled by another internal signal as well as an output enable signal OE. An output driver may also be embodied, thus varying the structures of an on-chip terminator and a terminator control circuit. For the sake of convenience, in the above embodiments of the present invention, predetermined first and second levels are described as a high level and a low level, respectively.

As described above, according to an embodiment of the present invention, an on-chip terminator is controlled by an internal signal, which is generated in synchronization with an outer clock by a delay-locked loop or the like, as an output enable signal for controlling enabling and disabling of an output driver. Therefore, timing loss is less than in a general on-chip terminator that is controlled asynchronously with an external signal, which increases efficiency of transmission of data. For this reason, an on-chip termination apparatus according to the present invention enables a system having a semiconductor chip according to the present invention to operate at high speed. In addition, an on-chip terminator is controlled by another signal as well as an output enable signal, thereby reducing power consumption.

What is claimed is:

1. A semiconductor integrated circuit comprising:
   an output buffer for generating an output driver driving signal in response to output data and a predetermined output enable signal;
   an output driver for transmitting the output data to outside of the semiconductor integrated circuit in response to the output driver driving signal;
   an on-chip terminator having at least one terminal resistor; and
   a terminator control circuit for turning on or off the on-chip terminator in response to the output enable signal, wherein the terminator control circuit comprises the same components as the output buffer and has substantially the same time delay as the output buffer.

2. The semiconductor integrated circuit of claim 1, wherein the terminator control circuit turns off the on-chip terminator in response to an activation of the output enable signal, and turns on the on-chip terminator in response to an inactivation of the output enable signal.

3. The semiconductor integrated circuit of claim 1, wherein a time spent by the terminator control circuit to turn on or off the on-chip terminator in response to the output enable signal, is substantially the same as a time spent by the output buffer to enable or disable the output driver in response to the output enable signal.

4. The semiconductor integrated circuit of claim 1, wherein the terminator control circuit turns on or off the on-chip terminator in response to a predetermined terminator driving signal as well as the output enable signal.

5. A semiconductor integrated circuit comprising:
   an output buffer for generating an output driver driving signal in response to output data and a predetermined output enable signal;
   an output driver for transmitting the output data to outside of the semiconductor integrated circuit in response to the output driver driving signal;
   an on-chip terminator; and
   a terminator control circuit for turning on or off the on-chip terminator in response to the output enable signal, wherein the on-chip terminator comprises:
   first and second termination resistors electrically connected to a pad;
   a first switch for electrically connecting the first terminal resistor to a terminal voltage; and
   a second switch for electrically connecting the second terminal resistor to a grounding voltage.

6. The semiconductor integrated circuit of claim 5, wherein the terminator control circuit generates a first termination control signal to turn on or off the first switch and a second termination control signal to turn on or off the second switch in response to the output enable signal.

7. The semiconductor integrated circuit of claim 1, wherein the output driver is a push-pull driver.

8. The semiconductor integrated circuit of claim 1, wherein the output driver is an open drain driver.

9. The semiconductor integrated circuit of claim 8, wherein the on-chip terminator comprises:
   the terminal resistor electrically connected to a pad; and
   a switch for electrically connecting the terminal resistor to a predetermined terminal voltage.

10. An on-chip termination apparatus installed in a semiconductor integrated circuit including a data output circuit for outputting data to the outside of the semiconductor integrated circuit via a pad and a data input circuit for receiving data from the outside via the pad, the on-chip termination apparatus comprising:
    an on-chip terminator including at least one terminal resistor electrically connected to the pad; and
    a terminator control circuit for turning on or off the on-chip terminator in response to an output enable signal that enables or disables the data output circuits, wherein the terminator control circuit comprises the same components as a circuit that enables or disables the data output circuit and has substantially the same delay time as the circuit that enables or disables the data output circuit in response to the output enable signal.

11. The on-chip termination apparatus of claim 10, wherein the terminator control circuit turns off the on-chip terminator in response to an activation of the output enable signal, and turns on the on-chip terminator in response to an inactivation of the output enable signal.

12. The on-chip termination apparatus of claim 10, wherein a time spent by the terminator control circuit to turn on or off the on-chip terminator in response to the output enable signal is substantially the same as a time spent by the data output circuit to be enabled or disabled in response to the output enable signal.

13. The on-chip termination apparatus of claim 10, wherein the terminator control circuit turns on or off the on-chip terminator in response to a predetermined terminator driving signal as well as the output enable signal.

14. An on-chip termination apparatus installed in a semiconductor integrated circuit including a data output circuit for outputting data to the outside of the semiconductor integrated circuit via a pad and a data input circuit for receiving data from the outside via the pad, the on-chip termination apparatus comprising:
    an on-chip terminator; and
    a terminator control circuit for turning on or off the on-chip terminator in response to an output enable signal that enables or disables the data output circuit, wherein the on-chip terminator comprises:
    first and second terminal resistors electrically connected to the pad;
    a first switch for electrically connecting the first terminal resistor to a terminal voltage; and a second switch for electrically connecting the second terminal resistor to a grounding voltage.

15. The on-chip termination apparatus of claim 14, wherein the terminator control circuit generates a first termination control signal for turning on or off the first switch and a second termination control signal for turning on or off the second switch in response to the output enable signal.

16. The on-chip termination apparatus of claim 10, wherein the on-chip terminator comprises;

the terminal resistor being electrically connected to the pad; and a switch for electrically connecting the terminal resistor to a predetermined terminal voltage.

17. A method for controlling an on-chip terminator in a semiconductor integrated circuit including the on-chip terminator that has at least one bi-directional data input/output unit, an output buffer, an output driver for transmitting output data to the outside of the semiconductor integrated circuit, and a terminator control circuit, wherein the terminator control circuit comprises the same components as the output buffer and has substantially the same time delay as the output buffer, the method comprising:

generating an output enable signal for enabling/disabling the output driver; and turning on or off the on-chip terminator in response to the output enable signal, wherein the on-chip terminator is turned off in response to an activation of the output enable signal and the on-chip terminator is turned on in response to an inactivation of the output enable signal.

18. The method of claim 17, wherein during turning on or off the on-chip terminator, a predetermined terminator driving signal is used in conjunction with the output enable signal.

* * * * *